(12) United States Patent
Anderson et al.

(10) Patent No.: US 7,981,772 B2
(45) Date of Patent: Jul. 19, 2011

(54) METHODS OF FABRICATING NANOSTRUCTURES

(75) Inventors: Brent A. Anderson, Jericho, VT (US); Andres Bryant, Burlington, VT (US); Edward J. Nowak, Essex Junction, VT (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 12/344,696

(22) Filed: Dec. 29, 2008

(65) Prior Publication Data

US 2010/0167504 A1   Jul. 1, 2010

(51) Int. Cl.
*H01L 21/3213* (2006.01)
(52) U.S. Cl. ............... 438/478; 257/E21.305; 977/888
(58) Field of Classification Search ............ 438/478; 977/762, 763, 888, 889; 257/E21.305–E21.313
See application file for complete search history.

(56) References Cited

U.S. PATENT DOCUMENTS

| | | | |
|---|---|---|---|
| 6,248,674 B1 | 6/2001 | Kamins et al. | |
| 6,720,240 B2 | 4/2004 | Gole et al. | |
| 6,962,823 B2 | 11/2005 | Empedocles et al. | |
| 7,018,549 B2 | 3/2006 | Metz et al. | |
| 7,105,428 B2 | 9/2006 | Pan et al. | |
| 7,109,072 B2 * | 9/2006 | Saito et al. | 438/149 |
| 7,112,525 B1 | 9/2006 | Bhansali et al. | |
| 7,129,554 B2 | 10/2006 | Lieber et al. | |
| 7,192,533 B2 | 3/2007 | Bakkers et al. | |
| 7,211,143 B2 | 5/2007 | Yang et al | |
| 7,230,286 B2 | 6/2007 | Cohen et al. | |
| 7,233,041 B2 | 6/2007 | Duan et al. | |
| 7,235,129 B2 | 6/2007 | Chen et al. | |
| 7,242,601 B2 | 7/2007 | Dehon et al. | |
| 7,256,466 B2 | 8/2007 | Lieber et al. | |
| 7,259,106 B2 | 8/2007 | Jain | |
| 7,339,184 B2 | 3/2008 | Romano et al. | |
| 2006/0216897 A1 * | 9/2006 | Lee et al. | 438/282 |
| 2008/0061284 A1 * | 3/2008 | Chu et al. | 257/9 |

FOREIGN PATENT DOCUMENTS

| | | |
|---|---|---|
| WO | 03/077298 | 9/2003 |
| WO | 2004/046021 | 6/2004 |
| WO | 2005/064639 | 7/2005 |

OTHER PUBLICATIONS

International Search Report and Written Opinion for corresponding International Application No. PCT/EP2009/067173.
Liu et al., "Study on Thermal Oxidation of Si Nanowires", Jan. 1, 1998, Physical Status Solidi (A). Applied Research, pp. 441-446.
Monfray et al., "Applications of SiGe Material for CMOS and Related Processing", Bipolar/BICMOS Circuits and Technology Meeting, 2006, pp. 1-7.

\* cited by examiner

*Primary Examiner* — Matthew Smith
*Assistant Examiner* — Daniel Shook
(74) *Attorney, Agent, or Firm* — Richard Kotulak; Roberts Mlotkowski Safran & Cole, P.C.

(57) ABSTRACT

A method is shown for fabricating nanostructures, and more particularly, to methods of fabricating silicon nanowires. The method of manufacturing a nanowire includes forming a sandwich structure of SiX material and material Si over a substrate and etching the sandwich structure to expose sidewalls of the Si material and the SiX material. The method further includes etching the SiX material to expose portions of the Si material and etching the exposed portions of the Si material. The method also includes breaking away the Si material to form silicon nanowires.

21 Claims, 4 Drawing Sheets

Salicidation

US 7,981,772 B2

METHODS OF FABRICATING NANOSTRUCTURES

FIELD OF THE INVENTION

The invention relates to the fabrication of nanostructures, and more particularly, to methods of fabricating silicon nanowires.

BACKGROUND OF THE INVENTION

Nanotechnology has become a very important tool in the scaling of devices and more particularly in integrated circuit manufacturing techniques. For example, nanowires are now being used to form transistors in integrated circuits, which may be used for various devices such as, for example, LCD panels. Currently, though, nanowires are fabricated using a "top-down" technique. That is, nanowires are fabricated in a vertical orientation. However, this traditional methodology cannot achieve the precision required for certain electronics.

For example, in the top down methodology, a silicon nanowire is formed by etching from a top, downwards into a silicon material. This forms a tightly clustered plurality of vertically oriented nanowires, i.e., perpendicular with respect to the planar surface of the silicon material. However, in this orientation it is very difficult to change the characteristics of the nanowires prior to breaking them from the silicon material. Specifically, as the nanowires are densely packed (e.g., tightly clustered) and formed in a vertical orientation, it is difficult to gain access to them in order to make any modifications such as, for example, change their shapes or provide a silicide implant.

Accordingly, there exists a need in the art to overcome the deficiencies and limitations described hereinabove.

BRIEF SUMMARY OF THE INVENTION

In a first aspect of the invention, a method of manufacturing a nanowire comprises forming a sandwich structure of SiX material and material Si over a substrate and etching the sandwich structure to expose sidewalls of the Si material and the SiX material. The method further comprises etching the SiX material to expose portions of the Si material and etching the exposed portions of the Si material. The method also comprises breaking away the Si material to form silicon nanowires.

In another aspect of the invention, a method of forming a plurality of nanowires in a horizontal plane comprises growing alternate layers of Si material and SiGe material over a substrate and capping an uppermost layer of the SiGe material with a capping layer. A trench is formed to the substrate by etching through the alternate layers of Si material and SiGe material and the capping layer to expose sidewalls of the alternate layers of the Si material and the SiGe material. The SiGe is selectively etched away to expose planar surfaces of the Si material. The Si material is thinned to form a pattern by etching the planar surfaces the Si material. The Si material is broken away from non-etched portions of the SiGe material to form silicon nanowires.

In another aspect of the invention, a method of forming nanowires, comprises: providing alternate epitaxial SiGe layers and Si layers on a substrate, where a selectively of the SiGe layers to the Si layers is about 100:1; depositing a nitride cap on an uppermost SiGe layer; forming a trench to the substrate by etching an opening in the SiGe layers, the Si layer and the nitride cap to expose sidewalls of the SiGe layers and the Si layers; etching the SiGe layers to expose surfaces of the Si layers; etching the exposed surfaces of the Si layers in order to narrow the Si layers; and breaking away the Si layers attached to any remaining SiGe material at ends thereof.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The invention relates to the fabrication of nanostructures, and more particularly, to methods of fabricating silicon nanowires. In embodiments, the method of fabricating the silicon nanowires includes etching several layers of silicon and intervening material (e.g., SiX) to simultaneously manufacture a plurality of silicon nanowires in a horizontal plane. Compared to the fabrication of nanowires in a vertical plane, the method of the present invention provides the flexibility to manufacture complex shapes and make other modifications to the nanowires at a lower cost. Accordingly, in implementation, the invention provides a low cost, flexible method of manufacturing silicon nanowires of different complex shapes and/or with other types of modifications.

Figure 1:
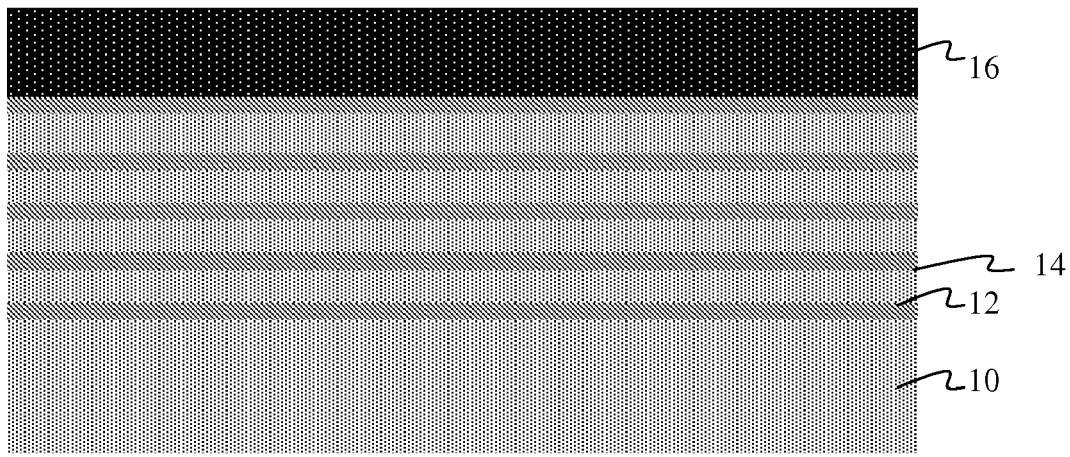
FIGS. 1-5 show structures and respective processing steps in accordance with aspects of the invention.

FIG. 1 shows a beginning structure and respective processing steps in accordance with aspects of the invention. More specifically, FIG. 1 shows a base substrate (wafer) 10 made from, for example, silicon or other known materials such as, for example, SOI. An epitaxial SiX layer 12 and Si layer 14 are alternately grown on the substrate 10 in a conventionally known manner. This alternate growth forms a sandwich structure of SiX (hereinafter referred to as SiGe) and Si.

X is an impurity such as, for example, Ge. As such, in embodiments, the SiX layers 12 are preferably SiGe. Although only five layers of SiGe and four layers of Si are shown, it is contemplated that more or less than these layers can be provided by the present invention. For example, in one illustrative, non-limiting example, 1-25 layers each of SiGe and Si are contemplated by the present invention.

In embodiments, the SiGe layers can range in thickness from about 2 nm to about 500 nm, depending on the particular application of the invention. Similarly, the Si layers 14 can range in thickness from about 2 nm to about 500 nm or more, with no practical limit to the length of the Si layer 14. Additionally, the selectivity of SiGe to Si is about 100:1. This selectivity ensures that subsequent etching processes of the SiGe will not attack the Si to such an extent as to completely etch away or destroy the Si layers, which form the nanowires of the present invention.

A nitride cap 16 is deposited on the final SiGe layer 12. The nitride cap 16 protects the underlying Si layers 12 during vertical etching processes. For example, in this role, the nitride cap 16 will protect an uppermost SiGe layer thereby ensuring that the uppermost SiGe layer will not be etched away during a vertical etching process. This, in turn, protects the underlying Si layers 14, e.g., a vertical etching process will not attack the Si layers. In optional embodiments, the nitride cap 16 can act as a template for the different shapes of nanowires formed from the Si layers 14.

Figure 2:
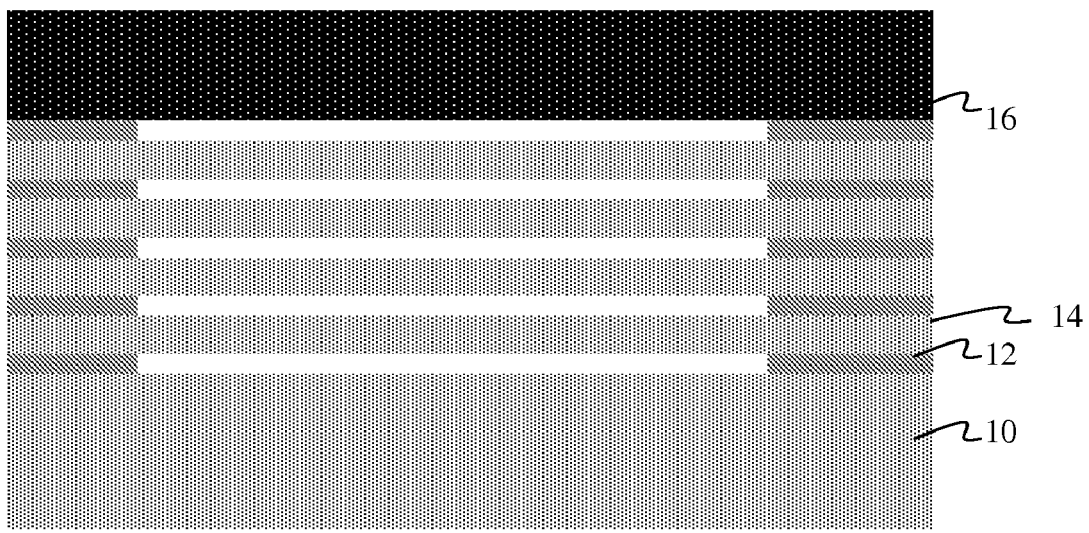
Figure 3:
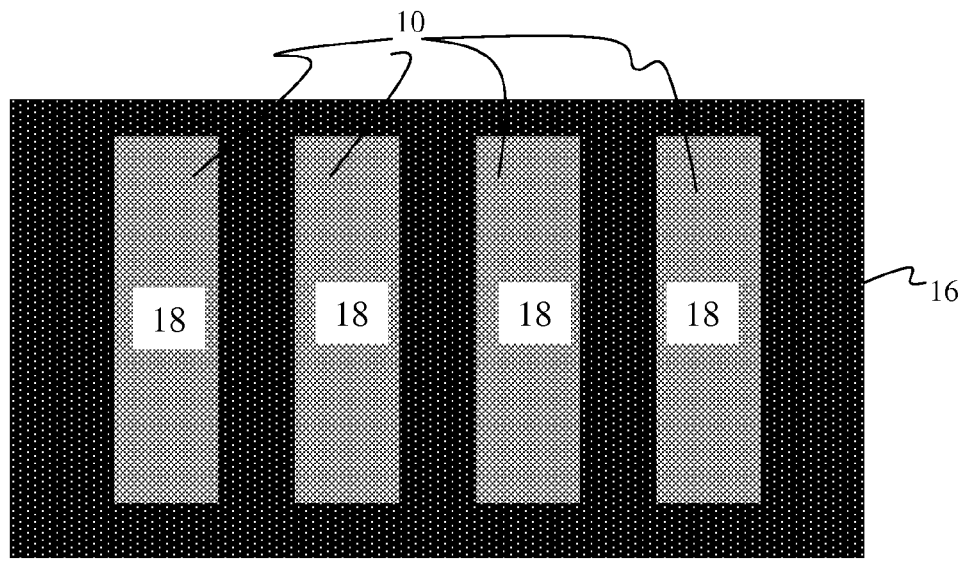

FIGS. 2 and 3 show an intermediate structure and respective processing steps in accordance with aspects of the invention. FIG. 3 is a top view of FIG. 2. More specifically, referring to FIGS. 2 and 3, the structure of FIG. 1 is subject to an etching process which forms vertical trenches 18 through the nitride cap 16 and underlying epitaxial SiGe layers 12 and Si layers 14. The etching stops at the substrate 10. This etching step exposes the sidewalls of the SiGe layers 12 and Si layers 14, which are subject to subsequent etching steps that are used to form the Si nanowires. The trenches 18 can be of any desired shape.

More specifically, using conventional lithography and reactive ion etching processes, a resist (not shown) is deposited over the structure of FIG. 1. Using a light source, for example, openings are formed in the resist (which correspond to the shape of the opening 18 shown in FIG. 3). A reactive ion etching, preferably a dry etching process, attacks the nitride cap 16 and underlying epitaxial SiGe layers 12 and Si layers 14 to form the trenches 18. In embodiments and although more expensive than wet etching techniques, a dry etch can be used in order to provide finer features such as, for example, deep vertical sidewalls.

Figure 4:
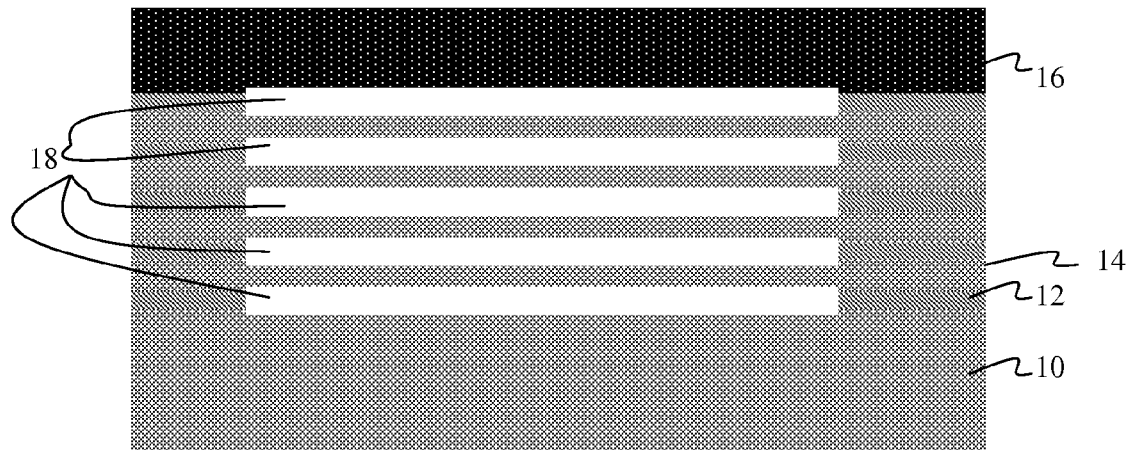

FIG. 4 shows another intermediate structure and respective processing steps in accordance with aspects of the invention. In FIG. 4, the structure is subject to an etching process to narrow or reduce the size of the Si layers 14. More specifically, as the sidewalls of the SiGe layers 12 are exposed, a selective etching process to the SiGe layers 12 is performed to attack the SiGe layers 12. This selective etching process will strip or etch away the SiGe layers 12 between (e.g., above and below) the Si layers 14, in order to form free floating portions of the Si layers 14. The etching will also expose planar surfaces of the Si layers 14. The selective etching process can be, for example, an isotropic wet etching process.

A subsequent etching process is performed to thin and/or shape the Si layers 14. More specifically a wet etching process is performed to etch away the planar surfaces, e.g., exposed portions, of each of the Si layers 14. Continuing with this etching process, the Si layers 14 will begin to narrow. In embodiments, the Si layers 14 can have an aspect ratio of width to thickness of about 10:1 to 100:1, for example. Also, there is no practical limit to the length of the Si layers 14, which will form the silicon nanowires. Also, the Si layers 14 can be etched to practically any desired shape by forming a certain resist shape, e.g., forming openings in the resist (using conventional lithography processes) of certain sizes and shapes, prior to the subsequent etching process. The Si layers, as should be understood by those of skill in the art, will form the silicon nanowires of the present invention.

In embodiments, it is also possible to control the crystal orientation of the nanowires by aligning the wires with the X Y (<100, 110>) orientation of the underlying substrate 10. For example, prior to etching, the structure is rotated relative to the mask image to a certain desired orientation. As the structure is now rotated, the etching process can form a wire pattern in a desired orientation with respect to the underlying substrate 10. In this way, the pattern can be aligned with the crystal orientation <100, 110> of the substrate 10.

Figure 5:
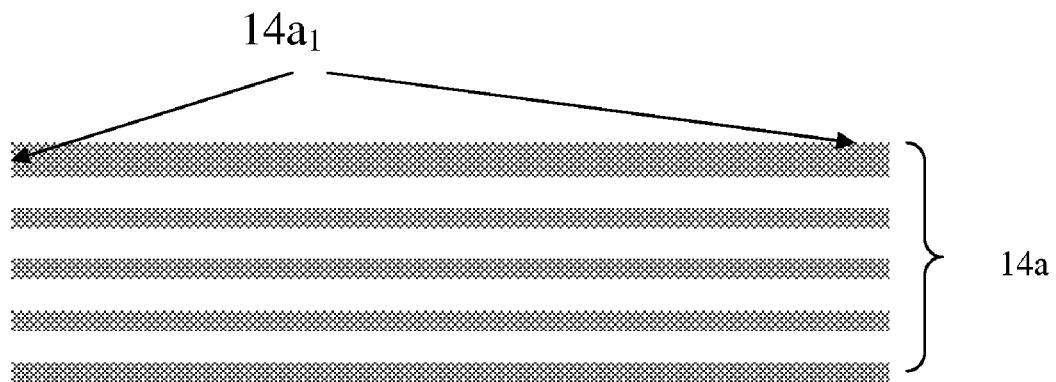

FIG. 5 shows another intermediate structure and respective processing steps in accordance with aspects of the invention. In FIG. 5, the nanowires 14a are detached from the structure of FIG. 4 using conventional etching processes. For example, ends 14$a_1$ of the nanowires 14a are broken off from the remaining structure of FIG. 4 using conventional masking and etching processes. Illustratively, a mask can be placed over the Si layers 14 at a certain distance from the end of the structure of FIG. 5, e.g., near an edge of the SiGe. Thereafter, the structure is subject to an etching process to break away the nanowires 14a. This results in a plurality of nanowires 14a of uniform length and size. Those of skill in the art should understand that the original number of Si layers 14 will dictate the number of nanowires 14a. Also, the length of the nanowires 14a can be tailored to any length, depending on the placement of the mask.

Figure 6:
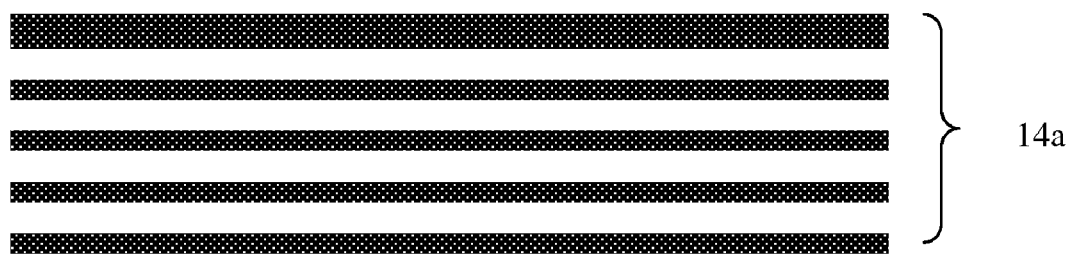
FIG. 6 shows alternative processing steps in accordance with aspects of the invention.

FIG. 6 shows alternative processing steps in accordance with aspects of the invention. In further embodiments, prior (or after) to the etching process of FIG. 4, for example, the Si layers 14 can be subject to a silicidation or oxidation process. For example, a dielectric material can be placed over the structure of FIG. 4 to protect certain areas. A resist used for the etching process is stripped to expose certain areas of the nanowires 14a. A metal is then deposited and reacted on the exposed areas. Any unreacted metal is then removed resulting in selective silicided areas. The dielectric can then be removed using conventional stripping processes.

Figure 7A:
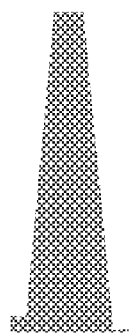
FIGS. 7A-7D show nanowires of various complex shapes formed in accordance with aspects of the invention.
Figure 7B:
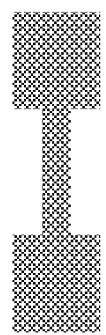
Figure 7C:
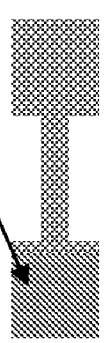
Figure 7D:
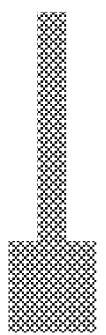

FIGS. 7A-7D show nanowires of various complex shapes formed in accordance with aspects of the invention. The nanowires of FIGS. 7A-7D are illustrative of the many different complex shapes of nanowires that can be formed using the methods of the present invention. For example, FIG. 7A shows a triangular shape, whereas, FIGS. 7B and 7C show a bone shape with a narrow central portion and two thicker end portions. FIG. 7C also shows a thicker portion of the nanowire formed with a salicide. FIG. 7D shows a "T" shaped structure with a narrow portion and a thicker end portion. These shapes can be formed easily, as the nanowires are formed in a horizontal plane.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a nanowire, comprising:
   forming a sandwich structure of SiX material and Si material over a substrate;
   etching the sandwich structure to expose sidewalls of the Si material and the SiX material;
   etching the SiX material to expose portions of the Si material;
   etching the exposed portions of the Si material; and
   breaking away the Si material from remaining structures including the substrate to form free standing silicon nanowires,
   wherein X is an impurity.

2. The method of claim 1, wherein the impurity is Ge.

3. The method of claim 1, wherein the etching of the exposed portions of the Si material is an isotropic etching process.

4. The method of claim 1, wherein the sandwich structure comprises the Si material between the SiX material with at least 1 to 25 layers of the Si material.

5. The method of claim 4, further comprising depositing a capping layer on an uppermost layer of the SiX material prior to the masking and etching of the sandwich.

6. The method of claim 5, wherein the capping is a deposition of nitride.

7. The method of claim 1, wherein a selectivity of the SiX material to the Si material is about 100:1.

8. The method of claim 1, wherein the etching the exposed portions of the Si material comprises depositing a resist layer, forming openings in the resist layer to a desired shape and etching the Si material through the openings to form a predetermined shape of the nanowires.

9. The method of claim 1, further comprising controlling a crystal orientation of the nanowires by rotating the sandwich structure relative to a mask image prior to the etching of the sandwich structure, the SiX material and the exposed portions of the Si material.

10. The method of claim 1, further comprising siliciding the nanowires.

11. The method of claim 1, wherein the breaking away is an etching processes.

12. The method of claim 11, wherein the free standing silicon nanowires are formed in a horizontal plane.

13. The method of claim 12, further comprising:
   depositing a capping layer over the sandwich structure; and
   etching vertical trenches through the capping layer and underlying sandwich structure to expose the sidewalls of the Si material and the SiX material.

14. A method of forming a plurality of nanowires in a horizontal plane, comprising:
   growing alternate layers of Si material and SiGe material over a substrate;
   capping an uppermost layer of the SiGe material with a capping layer;
   forming a trench to the substrate by etching through the alternate layers of Si material and SiGe material and the capping layer to expose sidewalls of the alternate layers of the Si material and the SiGe material;
   selectively etching away portions of the SiGe material to expose surfaces of the Si material;
   thinning the Si material by etching away the surfaces of the Si material to form a pattern; and
   breaking away the Si material from remaining structures including the substrate, capping layer, and non-etched portions of the SiGe material to form free standing silicon nanowires.

15. The method of claim 14, further comprising shaping the Si material to different shapes by depositing a resist, forming openings in the resist to expose portions of the Si material and etching the exposed portions of the Si material.

16. The method of claim 14, further comprising controlling a crystal orientation of the Si material by etching the alternate layers of Si material with SiGe with respect to a desired crystal orientation of the substrate.

17. The method of claim 14, further comprising siliciding the Si material prior to the breaking away.

18. A method of forming nanowires, comprising:
   providing alternate epitaxial SiGe layers and Si layers on a substrate, where a selectively of the SiGe layers to the Si layers is about 100:1;
   depositing a nitride cap on an uppermost SiGe layer;
   forming a trench to the substrate by etching an opening in the SiGe layer, the Si layer and the nitride cap to expose sidewalls of the SiGe layer and the Si layer;
   etching the SiGe layers to expose surfaces of the Si layers;
   etching the exposed surfaces of the Si layers in order to narrow the Si layers; and
   breaking away the Si layers attached to any remaining structures including the substrate, the nitride cap, and SiGe material at ends thereof to form free standing silicon nanowires.

19. The method of claim 18, further comprising controlling a crystal orientation of the Si layers by etching the Si layers in a desired orientation with respect to the substrate.

20. The method of claim 18, further comprising shaping the Si layers to different shapes by depositing a resist, forming openings in the resist to expose portions of the Si layers and etching the exposed portions of the Si layers.

21. The method of claim 18, further comprising siliciding desired areas of the Si layers prior to the breaking away by protecting certain areas of the Si layers with a dielectric, exposing the desired areas of the Si layers by opening a resist, depositing and reacting a metal on the desired areas and removing unreacted metal.

* * * * *